(12) United States Patent
Nagao et al.

(10) Patent No.: US 7,372,718 B2
(45) Date of Patent: May 13, 2008

(54) STORAGE AND SEMICONDUCTOR DEVICE (75) Inventors: Hajime Nagao, Nagasaki (JP);
Hidenari Hachino, Nagasaki (JP);
Tsutomu Sagara, Nagasaki (JP);
Hironobu Mori, Nagasaki (JP);
Nobumichi Okazaki, Kanagawa (JP);
Wataru Ootsuka, Tokyo (JP);
Tomohito Tsushima, Kanagawa (JP);
Chieko Nakashima, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/243,342

(22) Filed: Oct. 4, 2005

(65) Prior Publication Data
US 2006/0109316 A1 May 25, 2006

(30) Foreign Application Priority Data
Oct. 13, 2004 (JP) ............................ P2004-298289

(51) Int. Cl.
*G11C 11/00* (2006.01)
*G11C 11/14* (2006.01)

(52) U.S. Cl. ...................... 365/148; 365/158; 365/171; 365/173

(58) Field of Classification Search ................ 365/158, 365/171, 173, 148
See application file for complete search history.

(56) References Cited

U.S. PATENT DOCUMENTS 6,888,745 B2* 5/2005 Ehiro et al. .................. 365/158
6,888,773 B2* 5/2005 Morimoto .................... 365/148
6,937,505 B2* 8/2005 Morikawa .................... 365/158
6,992,920 B2* 1/2006 Tamai et al. ................. 365/158
7,016,222 B2* 3/2006 Morikawa .................... 365/158
7,057,922 B2* 6/2006 Fukumoto .................... 365/158
7,092,278 B2* 8/2006 Ishida et al. ................. 365/148
7,106,618 B2* 9/2006 Morimoto .................... 365/148
7,133,310 B2* 11/2006 Hidaka ........................ 365/158
7,167,387 B2* 1/2007 Sugita et al. ................ 365/148
7,203,088 B2* 4/2007 Ikegawa et al. ............. 365/158
2006/0067114 A1* 3/2006 Hachino et al.

* cited by examiner

*Primary Examiner*—Trong Phan
(74) *Attorney, Agent, or Firm*—Sonnenschein Nath & Rosenthal LLP (57) ABSTRACT A storage device includes a storage element having characteristics such that the resistance value thereof changes from a high state to a low state as a result of an electrical signal higher than or equal to a first threshold signal being applied and changes from a low state to a high state as a result of an electrical signal higher than or equal to a second threshold signal whose polarity differs from that of the first threshold signal being applied; and a circuit element that is connected in series to the storage element and that serves as a load, the storage element and the circuit element forming a memory cell, and the memory cells being arranged in a matrix, wherein the resistance value of the circuit element when the storage element is read differs from the resistance value when the storage element is written or erased.

7 Claims, 10 Drawing Sheets

STORAGE AND SEMICONDUCTOR DEVICE

CROSS REFERENCES TO RELATED APPLICATIONS

The present invention contains subject matter related to Japanese Patent Application JP 2004-298289 filed in the Japanese Patent Office on Oct. 13, 2004, the entire contents of which are incorporated herein by reference.

BACKGROUND OF THE INVENTION

1. Field of the Invention

The present invention relates to a storage device and a semiconductor device and, more particularly, to a storage device and a semiconductor device including a memory cell that uses storage elements for storing and holding information in accordance with the state of electrical resistance.

2. Description of the Related Art

In information devices, such as computers, as a random access memory, a DRAM (Dynamic Random Access Memory) that operates at a high speed and that has a high density is widely used. However, since the DRAM is a volatile memory such that information is erased when the power supply is switched off, there has been a demand for non-volatile memories in which information is not erased.

As a non-volatile memory that is thought to hold great promise in the future, an FeRAM (ferroelectric memory), an MRAM (magnetic memory), a phase-change memory, and resistance-change type memories such as a PMC (Programmable Metallization Cell) and an RRAM (Resistance RAM), have been proposed.

In the case of these memories, it is possible to hold written information for a long period of time even if power is not supplied. Furthermore, in the case of these memories, as a result of being formed to be non-volatile, it is considered that a refresh operation is eliminated and the power consumption can be reduced correspondingly.

In addition, resistance-change non-volatile memories, such as a PMC and an RRAM, are configured comparatively simple in such a manner that a material having characteristics such that the resistance value thereof changes as a result of a voltage and an electrical current being applied is used for a storage layer for storing and holding information, two electrodes are provided with the storage layer in between, and a voltage and an electrical current are applied to these two electrodes. Thus, fine patterning of storage elements is easy.

PMC is constructed so as to sandwich an ion conductor containing a predetermined metal between two electrodes, and uses characteristics such that, as a result of allowing a metal contained in the ion conductor to be further contained in one of the two electrodes, the electrical characteristics of the resistance or the capacitance of the ion conductor change when a voltage is applied between the two electrodes.

More specifically, the ion conductor is formed of a solid solution (for example, amorphous GeS or amorphous GeSe) of chalcogenide and a metal, and one of the two electrodes contains Ag, Cu, or Zn (refer to, for example, PCT Japanese Translation Patent Publication No. 2002-536840).

For the structure of an RRAM, for example, a structure in which a polycrystalline $PrCaMnO_3$ thin film is sandwiched between two electrodes and a voltage pulse or an electrical current pulse is applied between the two electrodes, causing the resistance value of $PrCaMnO_3$, which is a recording film, to be greatly changed is introduced (refer to, for example, W. W. Zhuang, "Novel Colossal Magnetoresistive Thin Film Nonvolatile Resistance Random Access Memory (RRAM)", Technical Digest "International Electron Devices Meeting", 2002, p. 193). Then, a voltage pulse whose polarity differs between when information is recorded (written) and when information is erased is applied.

Furthermore, for another structure of RRAM, for example, a structure in which $SrZrO_3$ (monocrystal or polycrystal) in which Cr is doped in small amounts is sandwiched between two electrodes, and an electrical current is made to flow from those electrodes, causing the resistance of the recording film to change is introduced (refer to, for example, A. Beck, "Reproducible switching effect in thin oxide films for memory applications", Applied Physics Letters, 2000, vol. 77, p. 139-141).

In this "Reproducible switching effect in thin oxide films for memory applications", I versus V characteristics of the storage layer are shown, and the threshold voltage during a recording and erasure is ±0.5 V. Also, in this structure, the recording and erasure of information are possible by the application of a voltage pulse, the necessary pulse voltage is set at ±1.1 V, and the necessary voltage pulse width is set at 2 ms. In addition, high-speed recording and erasure are possible, and operation at the voltage pulse width of 100 ns is reported. In this case, the necessary pulse voltage is ±5 V.

SUMMARY OF THE INVENTION

However, at the present situation, for an FeRAM, non-destructive reading thereof is difficult, and since destructive reading needs to be performed, the reading speed is slow. Furthermore, since there is a limitation in the number of polarization inversions due to reading or recording, there is a limitation in the number in which rewriting is possible.

MRAM needs a magnetic field for recording, and the magnetic field is generated by the electrical current that is made to flow through the wiring. As a result, a large amount of electrical current is necessary during a recording.

The phase-change memory is a memory in which recording is performed by applying a voltage pulse having the same polarity and a different magnitude. Since this phase-change memory causes switching to occur according to temperature, there is the problem in that this phase-change memory is sensitive to changes in ambient temperature.

In the PMC described in the PCT Japanese Translation Patent Publication No. 2002-536840, the crystallization temperature of amorphous GeS and amorphous GeSe is approximately 200° C., and when the ion conductor is crystallized, the characteristics are deteriorated. Therefore, PMC has the problem of not being capable of withstanding high temperatures in steps when the storage element is actually manufactured, for example, in steps of forming a CVD insulation film, a protective film, etc.

All the materials of the storage layer proposed in the structure of the RRAM described in W. W. Zhuang, "Novel Colossal Magnetoresistive Thin Film Nonvolatile Resistance Random Access Memory (RRAM)", Technical Digest "International Electron Devices Meeting", 2002, p. 193 and A. Beck, "Reproducible switching effect in thin oxide films for memory applications", Applied Physics Letters, 2000, vol. 77, p. 139-141 are crystalline materials. Therefore, problems arise in that heat treatment of approximately 600° C. is necessary, the manufacture of monocrystals of the proposed material is very difficult, and fine patterning becomes difficult because there is the influence of the grain boundary when polycrystals are used.

In addition, it has been proposed that, in the above-described RRAM, information is recorded or erased by applying a pulse voltage. However, in the proposed structure, the resistance value of the storage layer after recording changes depending on the pulse width of the applied pulse voltage. The fact that the resistance value after recording depends on the pulse width of the recording in this manner indirectly shows that the resistance value changes even when the same pulse is repeatedly applied.

For example, in the above-described "Novel Colossal Magnetoresistive Thin Film Nonvolatile Resistance Random Access Memory (RRAM)", it has been reported that, when a pulse of the same polarity is applied, the resistance value after recording is greatly changed depending on the pulse width thereof. RRAM has features such that, when the pulse width is shorter than or equal to 50 ns, the rate of change of resistance due to recording decreases, and when the pulse width is longer than or equal to 100 ns, the resistance value is not saturated at a fixed value but conversely approaches the resistance value before recording as the pulse width increases. In the above-described "Novel Colossal Magnetoresistive Thin Film Nonvolatile Resistance Random Access Memory (RRAM)", the characteristics of the memory structure in which the storage layer and a MOS transistor for controlling access are connected in series with each other and those are arranged in an array are introduced. Here, it has been reported that, when the pulse width was changed in the range of 10 ns to 100 ns, the resistance value of the storage layer after recording changes in accordance with the pulse width. When the pulse width is further increased, it is expected that the resistance decreases again owing to the characteristics of the storage layer.

More specifically, in the RRAM, since the resistance value after recording depends on the magnitude of the pulse voltage and the pulse width thereof, if there are variations in the magnitude of the pulse voltage and the pulse width thereof, the resistance value after recording varies.

Therefore, at a pulse voltage shorter than or equal to approximately 100 ns, the rate of change of resistance due to recording is small, and the influence of variations of the resistance value after recording is easily received. Consequently, it is difficult to stably perform recording.

Accordingly, when a recording is performed at such a short pulse voltage, in order to reliably perform a recording, it is necessary to perform the step of confirming (verifying) the content of the information after recording.

For example, the step of reading and confirming the content of information (the resistance value of the storage layer) that is already stored in the storage element is performed before recording, and recording is performed in such a manner as to correspond to the relationship between the confirmed content (the resistance value) and content to be recorded (the resistance value). Alternatively, the step of reading and confirming the content of information that is stored in the storage element is performed after recording, and when the resistance value differs from a desired resistance value, re-recording is performed to make a correction to the desired resistance value.

Therefore, it takes a longer time necessary for recording and, for example, it becomes difficult to perform overwriting of data at a high speed.

In order to solve the above-described problems, there has been proposed a storage device in which a memory cell includes a storage element having characteristics such that the resistance value thereof changes as a result of applying a voltage higher than or equal to a threshold voltage across both ends of the storage element; and a circuit element that is connected in series to the storage element and that serves as a load. The storage device has characteristics such that, when the voltage applied across both ends of the storage element and the circuit element is higher than or equal to a particular voltage higher than a threshold voltage, the combined resistance value of the storage element and the circuit element of the memory cell after the storage element is changed from a state in which the resistance value is high to a state in which the resistance value is low becomes a substantially fixed value regardless of the magnitude of the voltage (refer to, for example, Japanese Patent Application No. 2004-22121). Stable recording is realized by such a storage device, and the time necessary for recording information is shortened.

When the operation for causing the storage element to shift from a state in which the resistance value is high to a state in which the resistance value is low is defined as writing, when the operation for causing the storage element to shift from a state in which the resistance value is low to a state in which the resistance value is high is defined as erasure, and when the operation for making a determination as to the conduction state or the insulation state of the storage element is defined as reading, in order to realize a normal reading, it is necessary to define the voltage to be applied to the memory cell or the electrical current flowing through the memory cell so that writing or erasure is not performed mistakenly during a reading.

A technology for applying a voltage such that writing and erasure are not performed with respect to the memory cell so that writing or erasure is not performed mistakenly during a reading has been proposed (refer to, for example, Japanese Unexamined Patent Application Publication No. 2004-87069).

However, as described in Japanese Unexamined Patent Application Publication No. 2004-87069, when a voltage differing from the voltage applied to the memory cell during a writing and erasure is applied during a reading, a complex circuit for setting such a voltage becomes necessary. A storage device needing a complex circuit brings about a decrease in the access speed and an increase in the area of the memory cell.

The present invention has been made in view of the above points. It is desirable to provide a storage device and a semiconductor device that do not need a complex circuit.

According to an embodiment of the present invention, there is provided a storage device including: a storage element having characteristics such that the resistance value thereof changes from a high state to a low state as a result of an electrical signal higher than or equal to a first threshold signal being applied and changes from a low state to a high state as a result of an electrical signal higher than or equal to a second threshold signal whose polarity differs from that of the first threshold signal being applied; and a circuit element that is connected in series to the storage element and that serves as a load, the storage element and the circuit element forming a memory cell, and the memory cells being arranged in a matrix, wherein the resistance value of the circuit element when the storage element is read differs from the resistance value when the storage element is written or erased.

Here, as a result of setting the resistance value of the circuit element when the storage element is read as a predetermined resistance value differing from the resistance value when the storage element is written or erased, an electrical signal to be applied to the storage element can be controlled, and a normal reading can be performed without mistakenly performing writing and erasure during a reading.

According to another embodiment of the present invention, there is provided a semiconductor device including: a storage element having characteristics such that the resistance value thereof changes from a high state to a low state as a result of an electrical signal higher than or equal to a first threshold signal being applied and changes from a low state to a high state as a result of an electrical signal higher than or equal to a second threshold signal whose polarity differs from that of the first threshold signal being applied; a circuit element that is connected in series to the storage element and that serves as a load, the storage element and the circuit element forming a memory cell, and the memory cells being arranged in a matrix; and circuit element control means for allowing the resistance value of the circuit element when the storage element is read to differ from the resistance value when the storage element is written or erased.

Here, it is possible for the circuit element control means that allows the resistance value of the circuit element when the storage element is read to differ from the resistance value when the storage element is written or erased to control an electrical signal to be applied to the storage element and to perform a normal reading without mistakenly performing writing and erasure during a reading.

In the storage device and the semiconductor device according to the embodiments of the present invention, a complex circuit for reading is not necessary. Thus, the power consumption can be reduced, and the access speed can be increased.

DESCRIPTION OF THE PREFERRED EMBODIMENTS

Preferred embodiments of the present invention will now be described below with reference to the drawings. In this embodiment, resistance-change type storage elements (hereinafter referred to as "memory elements") are used for memory cells in order to construct a storage device.

Figure 1:
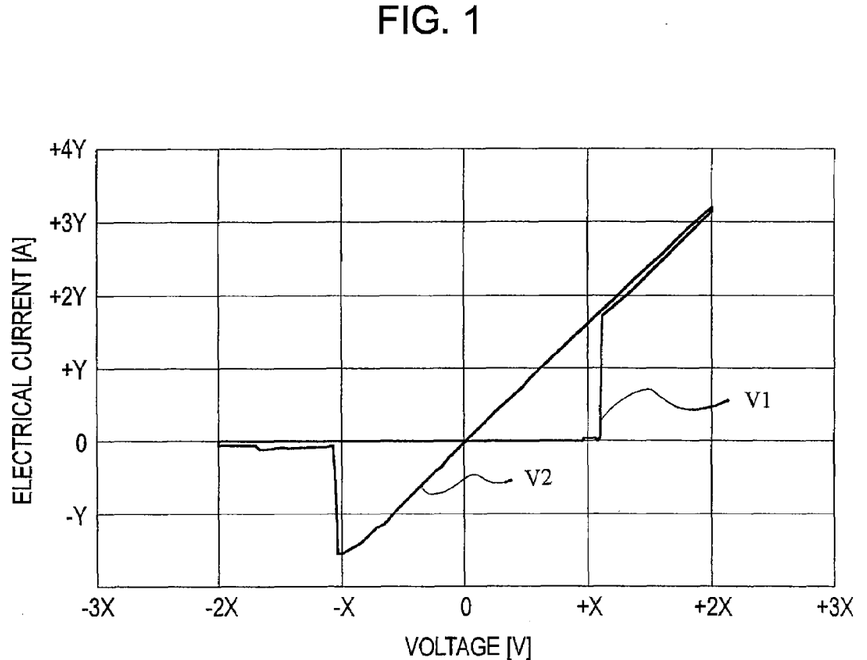
FIG. 1 is a graph showing changes in electrical current versus voltage (I-V) of a memory element (1) for use in an example of a storage device to which an embodiment of the present invention is applied.

FIG. 1 is a graph showing changes in electrical current versus voltage (I-V) of a memory element (1) for use in an example of a storage device to which an embodiment of the present invention is applied.

Examples of the memory element (1) having I-V characteristics shown in FIG. 1 include a storage element constructed with a storage layer sandwiched between a first electrode and a second electrode (for example, between a lower electrode and an upper electrode), the storage layer being formed of an amorphous thin film, such as a rare-earth oxide film.

This memory element (1) in the initial state has a large resistance value (for example, higher than 1 MΩ), and an electrical current is difficult to flow. When a voltage V1 in FIG. 1 is applied, and the voltage increases to higher than or equal to +1.1X [V] (for example, +0.5 V), the electrical current sharply increases, and the resistance value decreases (for example, several kΩ). Then, the memory element (1) changes to have ohmic characteristics, and the electrical current flows proportionally to a voltage, that is, the resistance value shows a fixed value. Thereafter, even if the voltage is returned to 0, the resistance value (a low resistance value) is continued to be held.

This operation will be hereinafter referred to as "writing", and this state is referred to as "conduction". The applied voltage at this time is referred to as a "writing voltage threshold value".

Next, a voltage V2 of a polarity opposite to that for writing is applied to the memory element (1). When the applied voltage is increased, the electrical current that flows through the memory element (1) sharply decreases at −1.1 X [V] (for example, −0.5 V) in FIG. 1, that is, the resistance value sharply increases and changes to the same high resistance value (for example, higher than 1 MΩ). Thereafter, even if the voltage is returned to 0 V, the resistance value (a high resistance value) is continued to be held.

This operation will be hereinafter referred to as "erasure", and this state is referred to as "insulation". The applied voltage at this time is referred to as an "erasure voltage threshold value".

In this manner, by applying a positive/negative voltage to the memory element (1), the resistance value of the memory element (1) can be changed reversibly from several kΩ to approximately 1 MΩ. When a voltage is not applied to the memory element (1), that is, when the voltage is 0 V, two states, that is, conduction and insulation states, can be taken. By making these states correspond to data 1 and 0, it is possible to store 1-bit data.

In FIG. 1, the range of the applied voltage is set at −2× to +2×. However, even if the applied voltage is made higher than that, in the memory element (1) used in an example of the storage device to which an embodiment of the present invention is applied, the resistance value hardly changes.

Figure 2A:
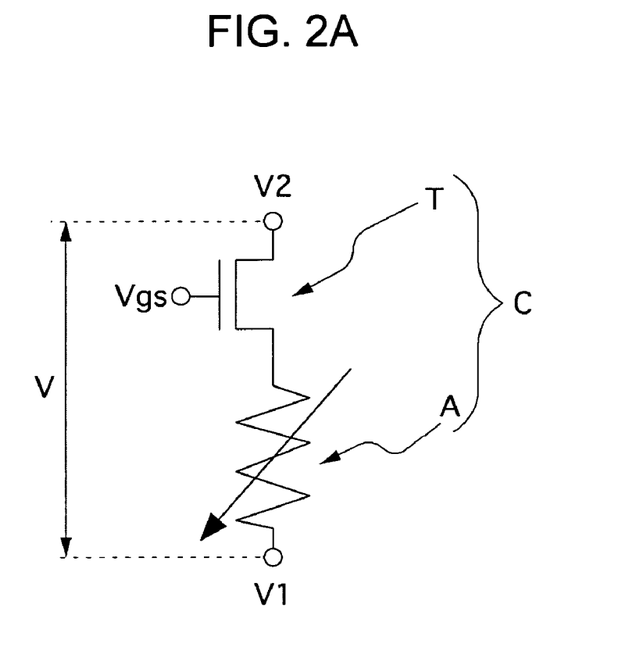
FIGS. 2A and 2B are circuit diagrams illustrating a memory cell for use in an example of a storage device to which an embodiment of the present invention is applied.
Figure 2B:
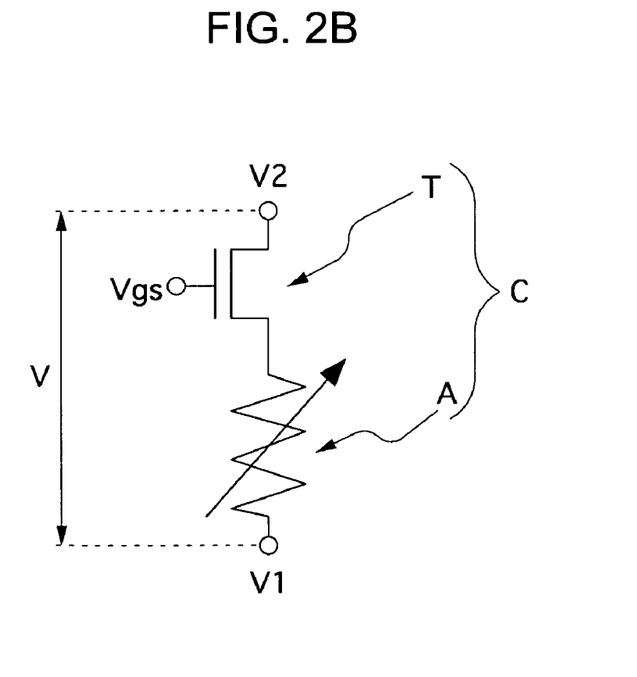

FIGS. 2A and 2B are circuit diagrams illustrating a memory cell for use in an example of a storage device to which an embodiment of the present invention is applied. A memory cell C shown herein is constructed in such a way that a MOS transistor T is connected in series to a memory element (1) A. As a result, the MOS transistor functions as a switching element for selecting a memory element to be accessed and also functions as a load for a memory element during a writing, as will be described later.

The construction is formed in such a way that a terminal voltage V1 is applied to the terminal on the opposite side of the terminal connected to the MOS transistor of the memory element (1), a terminal voltage V2 is applied to one of the terminals (for example, a terminal on the source side) on the opposite side of the terminal connected to the memory element (1) of the MOS transistor, and a gate voltage Vgs is applied to the gate of the MOS transistor.

Then, as a result of the terminal voltages V1 and V2 being applied across both ends of the memory element (1) and the MOS transistor constituting the memory cell, respectively, a voltage difference V (=|V2−V1|) occurs between the two terminals.

It is preferable that the resistance value during the writing in the memory device be nearly the same or higher than the on-resistance of the MOS transistor. The reason for this is that, if the resistance value of the memory element at the time of starting an erasure is low, since most of the voltage difference applied across the terminal is applied to the MOS transistor, and a loss occurs in the power. Consequently, it is difficult to efficiently use the applied voltage for changes in the resistance of the memory element. Since the resistance value of the memory element at the time of starting a writing is sufficiently high, most of the voltage is applied to the memory element, and such a problem does not arise.

Here, on the basis of the polarities of the memory element (1) and the MOS transistor, the configurations of two kinds of memory cells shown in FIGS. 2A and 2B are conceived.

The arrow of the memory element (1) in FIGS. 2A and 2B indicates the polarity, and it is shown that, when a voltage is applied in the direction of the arrow, the state changes from the insulated state to the conduction state, that is, a writing operation is performed.

FIGS. 3 to 6 are circuit diagrams illustrating examples of a storage device to which an embodiment of the present invention is applied. The memory array shown herein is such that memory cells shown in FIGS. 2A and 2B are arranged in a matrix. On the basis of the polarities of the memory element (1) and the MOS transistor and on the basis of the arrangement relationship between the memory element (1) and the MOS transistor, the configurations of four kinds of memory arrays shown in FIGS. 3, 4, 5, and 6 are conceived.

Here, since the method of operating the memory array is identical in the memory arrays of FIGS. 3 to 6, a description is given below by using the circuit of FIG. 3 as an example.

Figure 3:
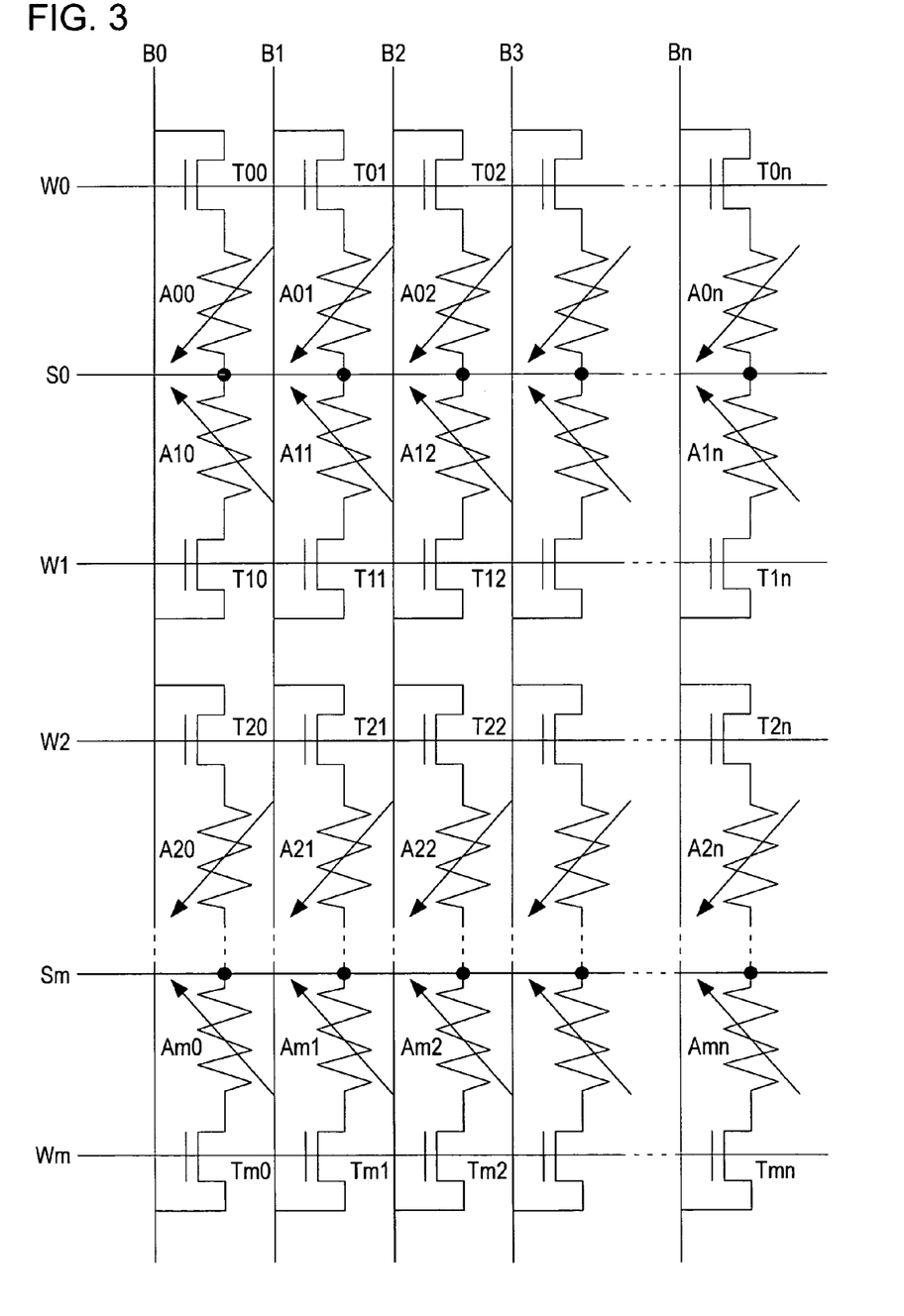
FIG. 3 is a circuit diagram (1) illustrating an example of a storage device to which an embodiment of the present invention is applied.
Figure 4:
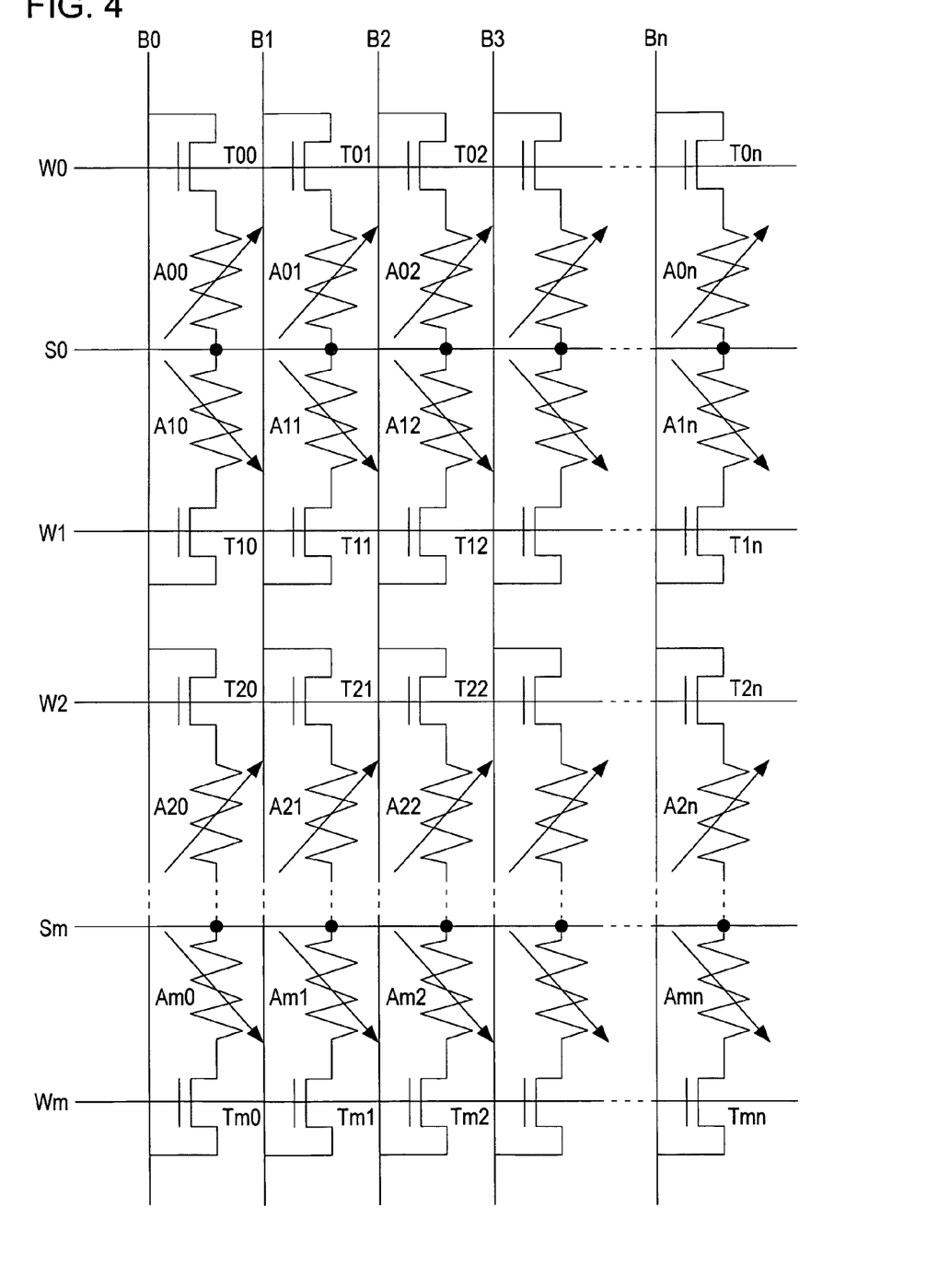
FIG. 4 is a circuit diagram (2) illustrating an example of a storage device to which an embodiment of the present invention is applied.
Figure 5:
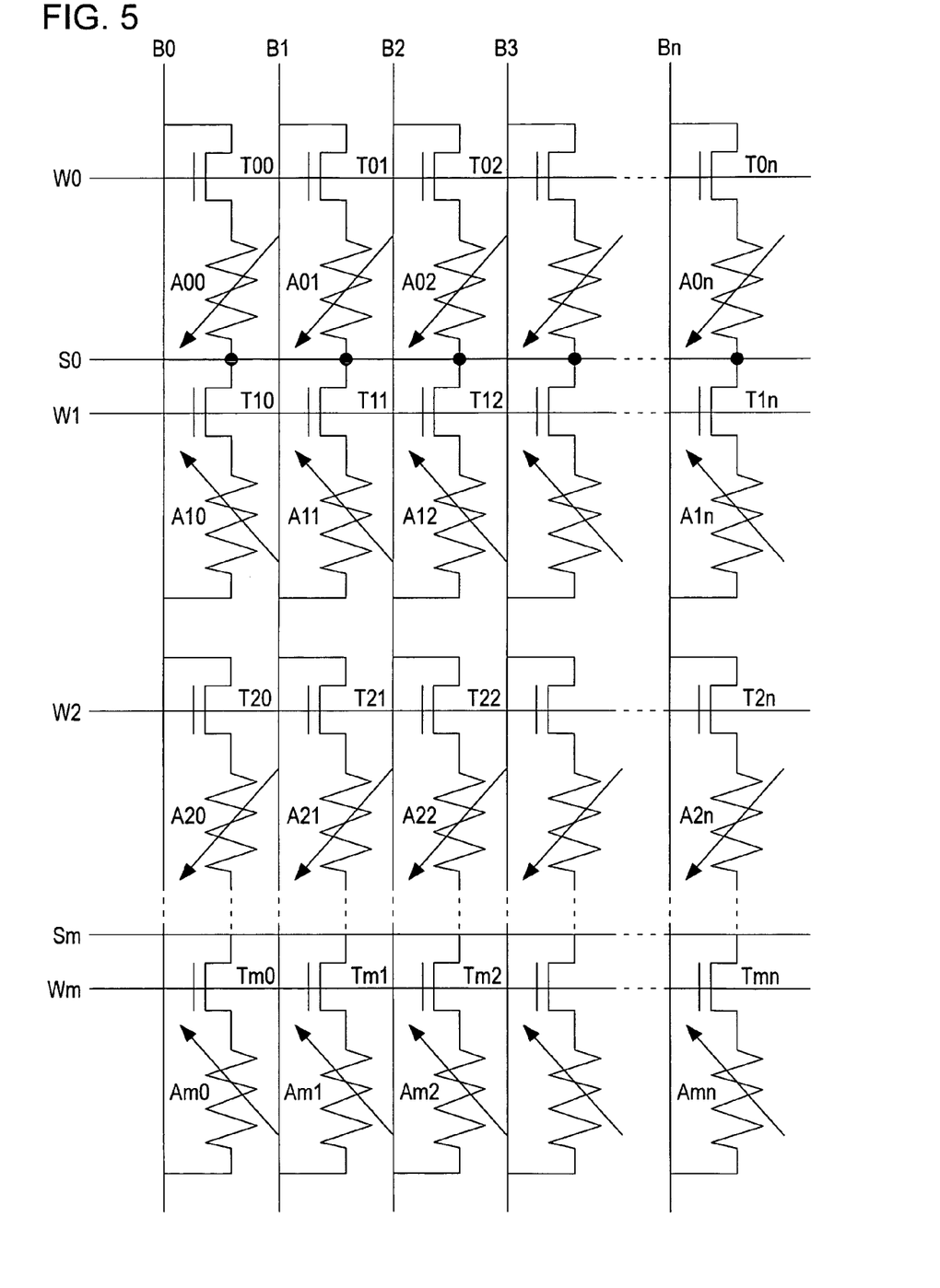
FIG. 5 is a circuit diagram (3) illustrating an example of a storage device to which an embodiment of the present invention is applied.
Figure 6:
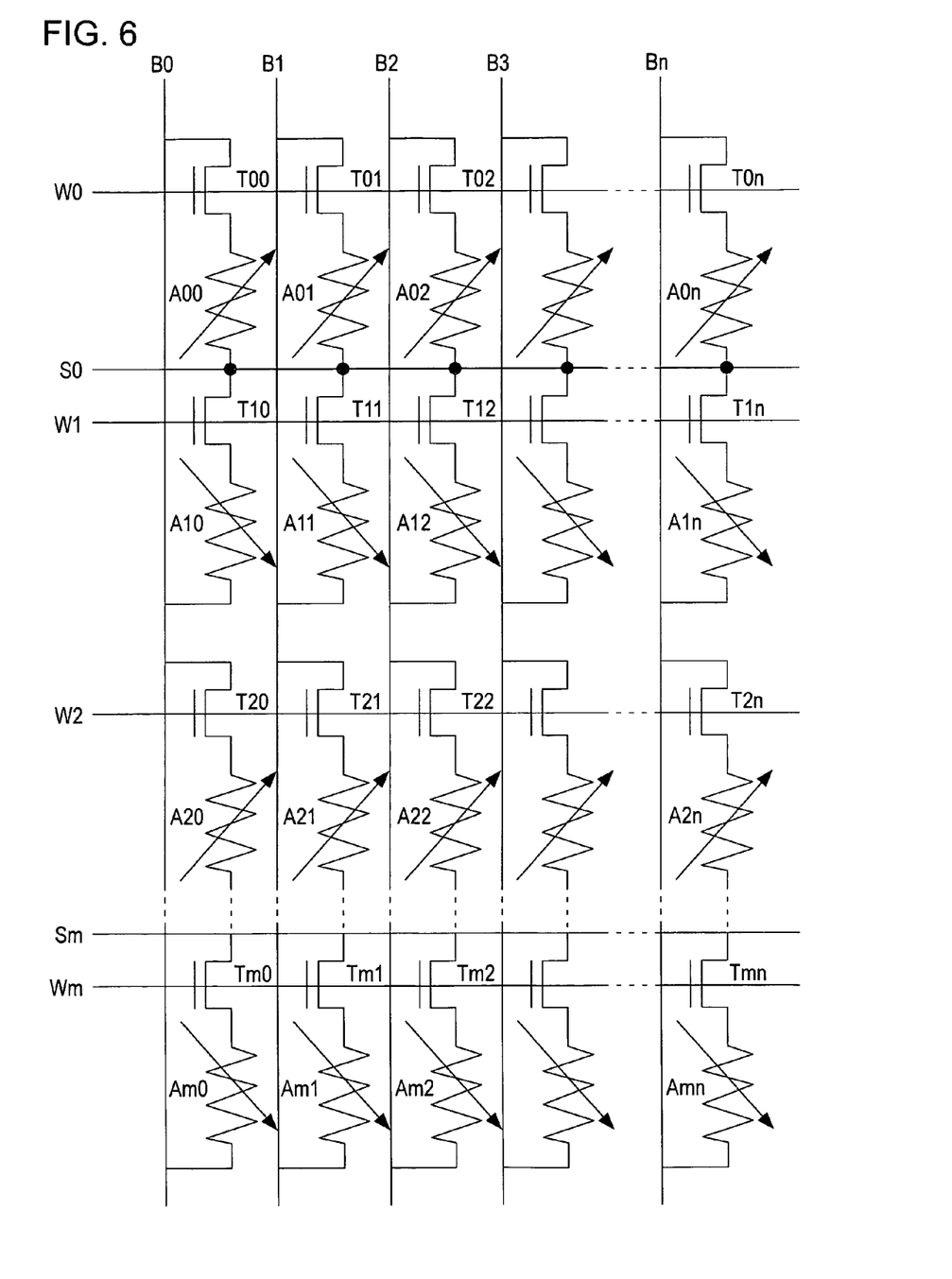
FIG. 6 is a circuit diagram (4) illustrating an example of a storage device to which an embodiment of the present invention is applied.

The storage device shown in FIG. 3 is constructed in such a manner that memory cells of (m+1) rows and (n+1) columns are arranged in a matrix. The memory cell is constructed in such a manner that, as shown in FIGS. 2A and 2B, one end of the memory element (1) is connected to one end (here the source) of the MOS transistor.

The gate of the MOS transistor T (T00 to Tmn) is connected to a word line W (W0 to Wm), the other end (the drain) of the MOS transistor is connected to a bit line B (B0 to Bn), and the other end of the memory element (1) is connected to the source line S (S0 to Sm).

In the storage device configured as described above, (1) Writing, (2) Erasure, and (3) Reading can be performed, for example, in the following manner.

(1) Writing

A writing into the memory cell is performed by applying a power-supply voltage Vdd (2.5 V) to the word line corresponding to the memory cell in which information should be recorded, by applying a power-supply voltage Vdd (2.5 V) to the bit line corresponding to the memory cell in which information should be recorded, and by applying a ground potential (0 V) to the source line. When the voltage is applied in this manner, since the memory element (1) is in an insulated state, most of the applied voltage between the bit line and the source line is applied to the memory element (1), the voltage of Vdd (2.5 V) is applied to the memory element (1), and this voltage exceeds the writing voltage threshold value (0.5 V). Consequently, the memory element (1) shifts from the insulated state of a high resistance value (higher than 1 MΩ) to the conduction state of a low resistance value (several kΩ).

In order that writing is not performed in the memory cell in which information is not recorded, 0 V is applied to the word lines other than the word lines corresponding to the memory cells in which information should be recorded and the bit lines other than the bit lines corresponding to the memory cells in which information should be recorded.

(2) Erasure

The erasure of the memory cell is performed by applying Vdd (2.5 V) to the word line corresponding to the memory cell in which information should be erased, by applying a ground potential (0 V) to the bit line corresponding to the memory cell in which information should be erased, and by applying Vdd (2.5 V) to the source line. When the voltage is applied in this manner, a voltage determined by the divided voltage of the resistance value before the memory element (1) is erased and the on-resistance value of the MOS transistor is applied to the memory element (1) in the direction reverse to that for the writing. That is, when the voltage between the bit line and the source line is denoted as Vbs, the resistance value before the memory element (1) is erased is denoted as Rm, and the on-resistance value of the MOS transistor is denoted as Rmos, the voltage Vm applied to the memory element (1) is represented by the following:

$$Vm = Vbs \times Rm/(Rm+Rmos)$$

As a result of this Vm exceeding the erasure voltage threshold value (−0.5 V), the memory element (1) shifts from the conduction state of a low resistance value (several kΩ) to the insulated state of a high resistance value (higher than 1 MΩ).

When the resistance value before the memory element (1) is erased is too low, there are cases in which a sufficient voltage is not applied to the memory element (1) and the memory element (1) cannot be is erased.

Figure 7:
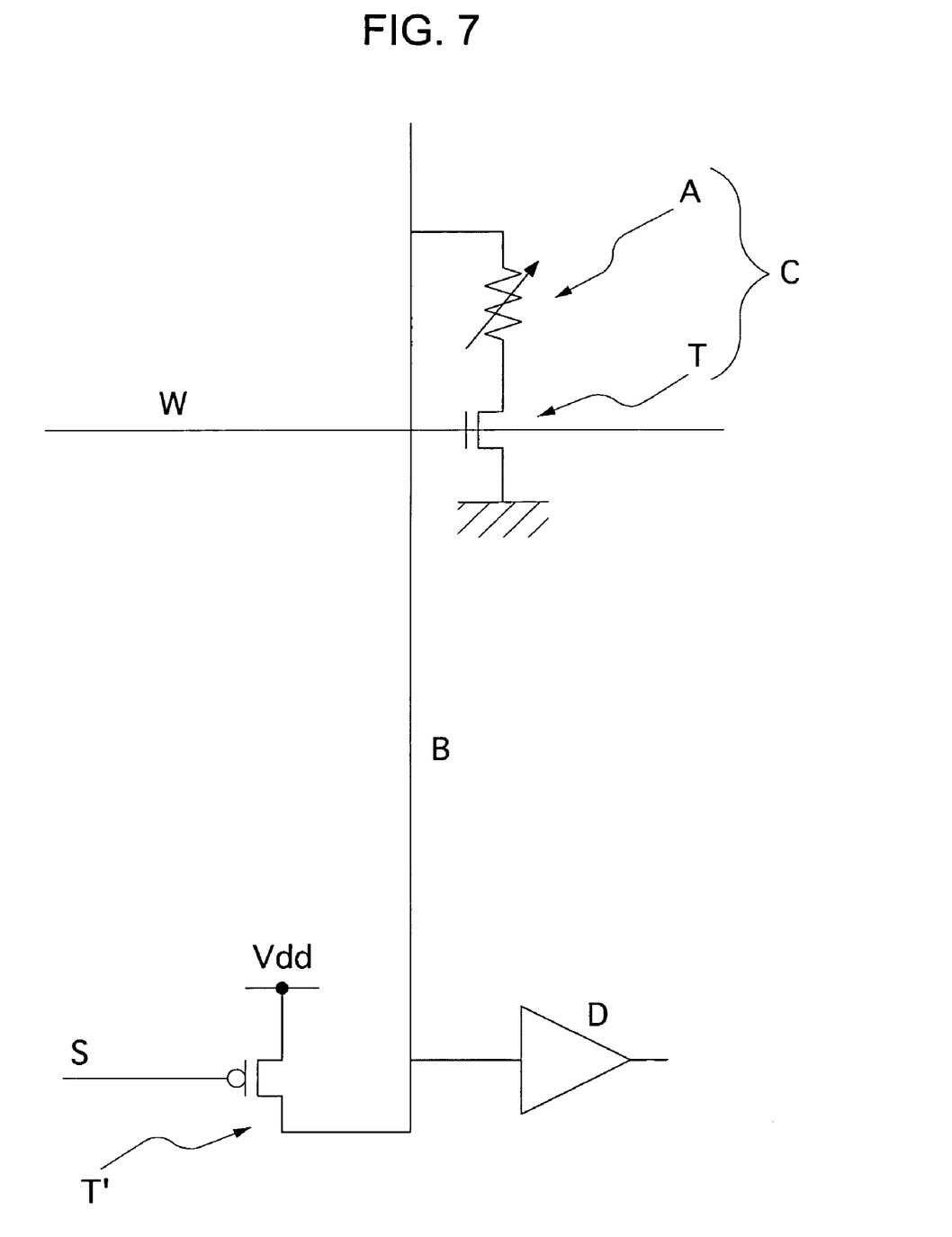
FIG. 7 is a circuit diagram illustrating a specific erasure procedure and a specific reading procedure.
Figure 8A:
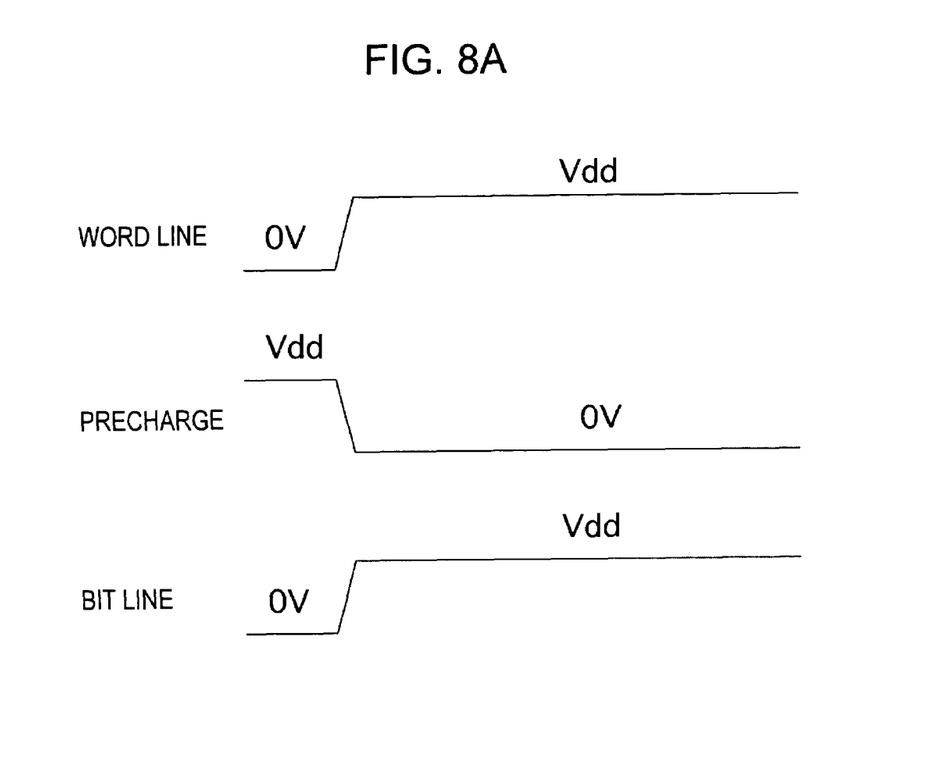
FIGS. 8A and 8B are timing charts of each pulse during an erasure and reading.

In a specific erasure procedure, as shown in FIG. 7, a precharge signal S supplied to the gate of the MOS transistor T' is turned on to apply the power-supply voltage Vdd (2.5 V) to the bit line connected to the power-supply voltage via the MOS transistor. Next, the word line is turned on to apply the power-supply voltage Vdd (2.5 V) to the word line. As a result, when the memory element (1) is in the conduction state, a voltage of 0.5 V or higher is applied to the memory element (1), and the memory element (1) shifts to the insulated state. When the memory element (1) is in the insulated state, since a voltage is applied in the direction of erasure, the insulated state is maintained. Thereafter, the precharge signal is turned off, and the word line is turned off, thereby completing the erasure. FIG. 8A shows a timing chart of a word line, a precharge signal, and a bit line during an erasure.

(3) Reading

A reading from the memory cell is described below differently between (A) when a voltage is applied in the direction of writing and (B) when a voltage is applied in the direction of erasure.

(A) When a Voltage is Applied in the Direction of Writing

In a method of applying a voltage in the direction of writing when reading from the memory cell, that is, in a method in which Vdd (2.5 V) is applied to the bit line corresponding to the memory cell from which information should be read and a ground potential (0 V) is applied to the source line, when the memory element (1) is in an insulated state, that is, when the resistance value is very high, the electrical potential (2.5 V) between the bit line and the source line is directly applied to the memory element (1) regardless of the electrical potential of the word line corresponding to the memory cell from which information should be read, and a writing is performed.

Therefore, it is not possible to perform a reading by applying a voltage in the direction of writing.

(B) When a Voltage is Applied in the Direction of Erasure

In a method of applying a voltage in the direction of erasure when reading from the memory cell, that is, in a method in which a ground potential (0 V) is applied to the bit line corresponding to the memory cell from which information should be read and Vdd (2.5 V) is applied to the source line, when the memory element (1) is in the conduction state, a voltage determined by the divided voltage of the resistance value before the memory element (1) is erased and the on-resistance value of the MOS transistor is applied to the memory element (1).

That is, by decreasing the voltage applied to the word line corresponding to the memory cell from which information should be read to be less than the voltage applied during a writing and by increasing the on-resistance value of the MOS transistor, the voltage applied to the memory element (1) can be decreased more than the erasure voltage threshold value. Thus, an erasure is not performed mistakenly, and a normal reading is possible.

When the memory element (1) is in an insulated state, since a voltage is applied in the direction of erasure, there is no change in the state of the memory element (1).

Figure 9:
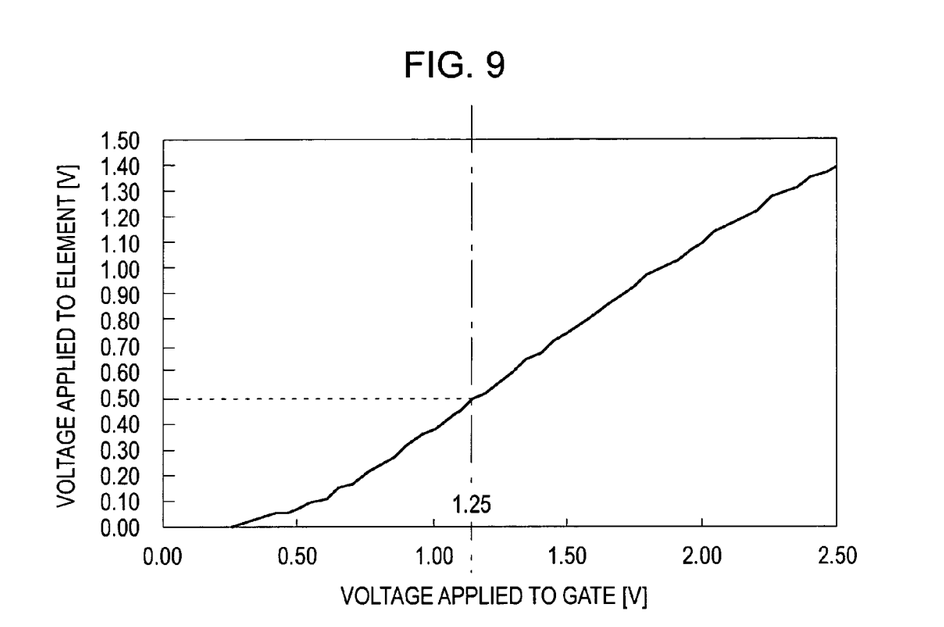
FIG. 9 is a graph showing the relationship between a voltage applied to the memory element (1) and the gate voltage of a MOS transistor.

FIG. 9 shows the relationship between the voltage applied to the memory element (1) and the gate voltage of a MOS transistor when a ground potential (0 V) is applied to the bit line and Vdd (2.5 V) is applied to the source line.

It can be seen from FIG. 9 that, if the gate voltage of the MOS transistor is set at 1.25 V or lower, the voltage applied to the memory element (1) becomes 0.5 V or lower, an erasure is not performed mistakenly, and a reading is possible normally.

Therefore, a normal reading can be performed by applying a ground potential (0 V) to the bit line corresponding to the memory cell from which information should be read, by applying Vdd (2.5 V) to the source line, and by applying a voltage of 1.25 V or lower to the word line corresponding to the memory cell from which information should be read.

The higher the gate voltage of the MOS transistor, the larger the reading electrical current, which is a signal during a reading, can be taken. Therefore, it is preferable that a voltage as high as possible (1.25 V) in a range in which an erasure is not performed mistakenly be applied to the word line corresponding to the memory cell from which information should be read.

Figure 8B:
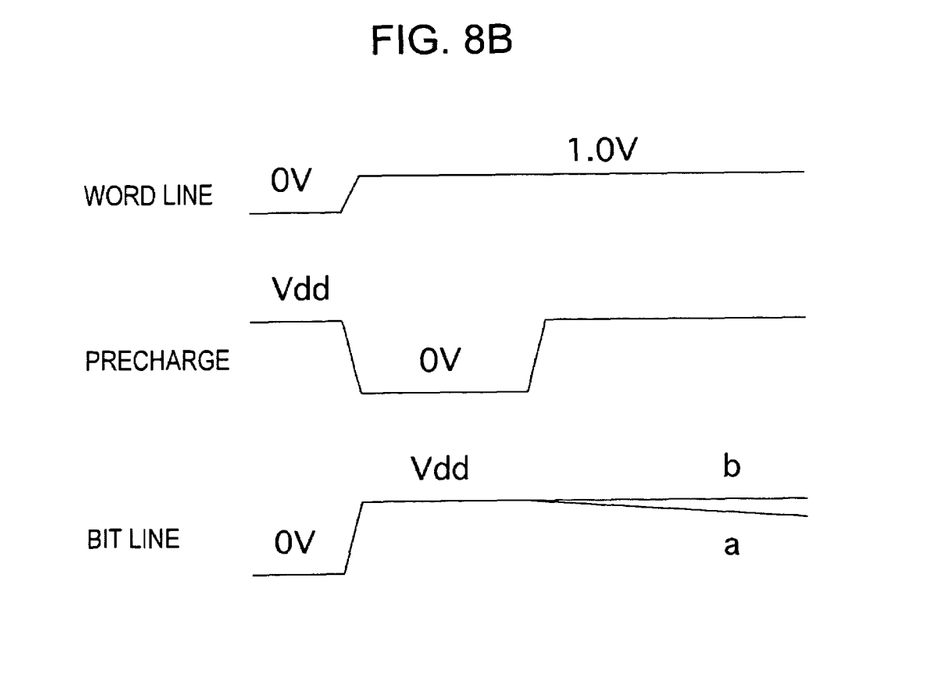

In a specific reading procedure, as shown in FIG. 7, a precharge signal S supplied to the gate of the MOS transistor T' is turned on, and a power-supply voltage Vdd (2.5 V) is applied to the bit line connected to the power-supply voltage via the MOS transistor. Next, the word line is turned on, and 1.0 V is applied to the word line. As a result, when the memory element (1) is in a conduction state, since the voltage applied to the memory element (1) is 0.5 V or lower, an erasure is not performed, and the conduction state is maintained. When the memory element (1) is in an insulated state, since the voltage is applied in the direction of erasure, the insulated state is maintained. Thereafter, the precharge signal is turned off, and the bit line is placed in an insulated state. Then, when the memory element (1) is in a conduction state, as indicated by the reference character a in FIG. 8B, the voltage of the bit line decreases, and when the memory element (1) is in an insulated state as indicated by the reference character b in FIG. 8B, the voltage of the bit line is maintained. Therefore, this voltage is detected using a sense amplifier D in order to make a determination as to the conduction state or the insulated state. FIG. 8B shows a timing chart of a word line, a precharge signal, and a bit line during a reading.

In an example of the storage device to which an embodiment of the present invention is applied, as a result of setting the gate voltage to be lower than that during a writing, a reading can be performed by setting the voltage of the bit line and the source line during a reading to be the same as that during a writing, and the circuit of the bit line for reading can be simplified. Thus, the cell area can be decreased, the power consumption can be reduced, and the access speed can be increased.

Figure 10:
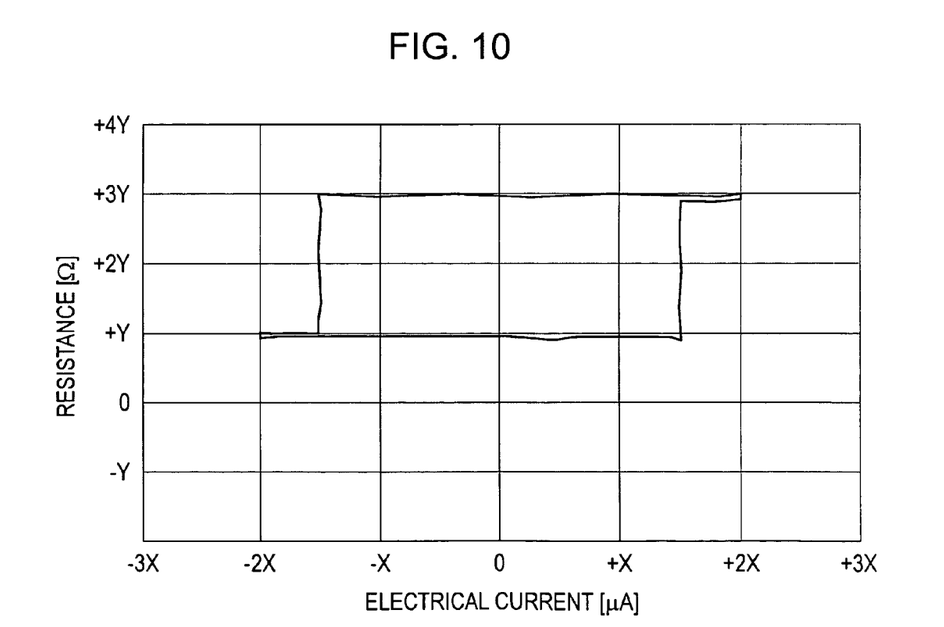
FIG. 10 is a graph showing changes in the electrical current versus resistance (I-R) of a memory element (2) for use in another example of a storage device to which an embodiment of the present invention is applied.

FIG. 10 is a graph showing changes in the electrical current versus resistance (I-R) of a memory element (2) for use in another example of a storage device to which an embodiment of the present invention is applied.

Examples of the memory element (2) having I-R characteristics shown in FIG. 10 include a storage element configured in such a way that a storage layer is sandwiched between a first electrode and a second electrode (for example, between a lower electrode and an upper electrode), wherein the storage layer is formed of at least two magnetic films and the magnetic films are separated by an insulator or a conductor.

The memory element (2) has a low resistance value in the initial state (for example, 5 kΩ). However, when an electrical current larger than or equal to +1.5×[A] (for example, 100 μA) of FIG. 10 flows therethrough, the resistance value increases (for example, 6 kΩ). Then, the resistance value shows a fixed value, and thereafter, even if the electrical current is returned to 0 A, the resistance value (a high resistance value) is continued to be held.

Hereinafter, this operation is referred to as a "Write0", and this state is referred to as a "high resistance state". The electrical current that flows at this time is referred to as a "Write0 electrical current threshold value".

Next, when an electrical current is made to flow to the memory element (2) in a direction reverse to that of Write0 and the value of the electrical current that is made to flow increases, the resistance value decreases at −1.5×[A] (for example, −100 μA) of FIG. 10 and shifts to a low resistance value (for example, 5 kΩ) which is the same as that in the initial state. Thereafter, even if the electrical current is returned to 0 A, the resistance value (a low resistance value) is continued to be held.

Hereinafter, this operation is referred to as a "Write1", and this state is referred to as a "low resistance state". The electrical current that flows at this time is referred to as a "Write1 electrical current threshold value".

In this manner, by making positive and negative electrical currents flow through the memory element (2), it is possible to reversibly change the resistance value of the memory element (2) from 5 kΩ to 6 kΩ. When the electrical current does not flow through the memory element (2), that is, when the electrical current is 0 A, two states, that is, a low resistance state and a high resistance state, can be taken. By making these states correspond to data 1 and 0, it is possible to store 1-bit data.

In FIG. 10, the range of the electrical current that is made to flow is set at −2× to +2×. However, even if the electrical current is made larger than that, in the memory element (2) used in another example of the storage device to which an embodiment of the present invention is applied, the resistance value hardly changes.

Also, in the memory cell used in the other example of the storage device to which an embodiment of the present invention is applied, similarly to the memory cell for use in an example of the storage device in which an embodiment of the present invention is applied, a MOS transistor is connected in series to the memory cell (2), and the MOS transistor functions as a load for the memory element (2).

The following points are the same as for the memory cell for use in an example of the storage device to which the above-described embodiment of the present invention is applied. A terminal voltage V1 is applied to the terminal on the side opposite to the terminal connected to the MOS transistor of the memory element (2), a terminal voltage V2 is applied to one of the terminals (for example, a terminal on the source side) on the side opposite to the terminal connected to the memory element (2) of the MOS transistor, a gate voltage Vgs is applied to the gate of the MOS transistor, and as a result of terminal voltages V1 and V2 being applied across both ends of the memory element (2) and the MOS transistor constituting the memory cell, respectively, a voltage difference V (=|V2−V1|) occurs across both ends.

The fact that two kinds of memory cells shown in FIGS. 2A and 2B can be conceived according to the polarities of the memory element (2) and the MOS transistor, and the fact that four kinds of memory arrays shown in FIGS. 3, 4, 5, and 6 can be conceived according to the polarities of the memory element (2) and the MOS transistor and according to the arrangement relationship of the memory element (2) and the MOS transistor apply the same to an example of the storage device to which the above-described embodiment of the present invention is applied.

In the storage device configured as shown in FIG. 3 by using the memory element (2), (1) Write1, (2) Write0, and (3) Reading can be performed, for example, in the following manner.

(1) Write1

Write1 of the memory cell is performed by applying a power-supply voltage Vdd (2.5 V) to the word line corresponding to the memory cell in which information should be recorded, by applying the power-supply voltage Vdd (2.5 V) to the bit line corresponding to the memory cell in which information should be recorded, and by applying a ground potential (0 V) to the source line.

As described above, when a voltage is applied, an electrical current flows through the memory element (2). The value of the electrical current that flows is determined by the combined resistance of the MOS transistor and the memory element (2), that is, the on-resistance value of the MOS transistor. That is, if the voltage between the bit line and the source line is denoted as Vbs, the resistance value before Write1 of the memory element (2) is performed is denoted as Rm, and the on-resistance value of the MOS transistor is denoted as Rmos, the electrical current Im that flows through the memory element (2) is represented by the following:

$$Im = Vbs/(Rm+Rmos)$$

Since Im exceeds the Write1 electrical current threshold value (−100 μA), the memory element (2) shifts from a high resistance state of a high resistance value (6 kΩ) to a low resistance state of a low resistance value (5 kΩ).

In order that Write1 is not performed in the memory cell in which information should not be recorded, 0 V is applied to the word lines other than the word lines corresponding to the memory cells in which information should be recorded and to the bit lines other than the bit lines corresponding to the memory cells in which information should be recorded.

(2) Write0

Write0 of the memory cell is performed by applying Vdd (2.5 V) to the word line corresponding to the memory cell in which information should be recorded, by applying a ground potential (0 V) to the bit line corresponding to the memory cell in which information should be recorded, and by applying Vdd (2.5 V) to the source line.

When a voltage is applied in this manner, an electrical current flows through the memory element (2) in a direction reverse to that of Write1. The electrical current Im that flows through the memory element (2) is represented by the following:

$$Im = Vbs/(Rm+Rmos)$$

Since Im exceeds the Write0 electrical current threshold value (100 μA), the memory element (2) shifts from a low resistance state of a low resistance value (5 kΩ) to a high resistance state of a high resistance value (6 kΩ).

(3) Reading

A reading from the memory cell is described below differently between (A) when an electrical current is made to flow in the direction of Write0 and (B) when an electrical current is made to flow in the direction of Write1.

(A) When an Electrical Current is Made to Flow in the Direction of Write0

In the case of a method of making an electrical current flow in the direction of Write0 during a reading from the memory cell, that is, in the case of a method of applying a ground potential (0 V) to the bit line corresponding to the memory cell from which information should be read and for applying Vdd (2.5 V) to the source line, the electrical current that flows can be determined simply by only the electrical current driving performance of the MOS transistor.

In this case, in any case of the low resistance state and the high resistance state, the combined resistance of the on-resistance value of the MOS transistor and the memory element (2), that is, the electrical current that is determined by the on-resistance value of the MOS transistor, flows through the memory element (2).

That is, by decreasing the voltage applied to the word line corresponding to the memory cell from which information should be read more than the voltage applied during Write0 time and by increasing the on-resistance value of the MOS transistor, it is possible to decrease the electrical current that flows through the memory element (2) more than the Write0 electrical current threshold value. Thus, Write0 is not performed mistakenly, and normal reading is possible.

Figure 11:
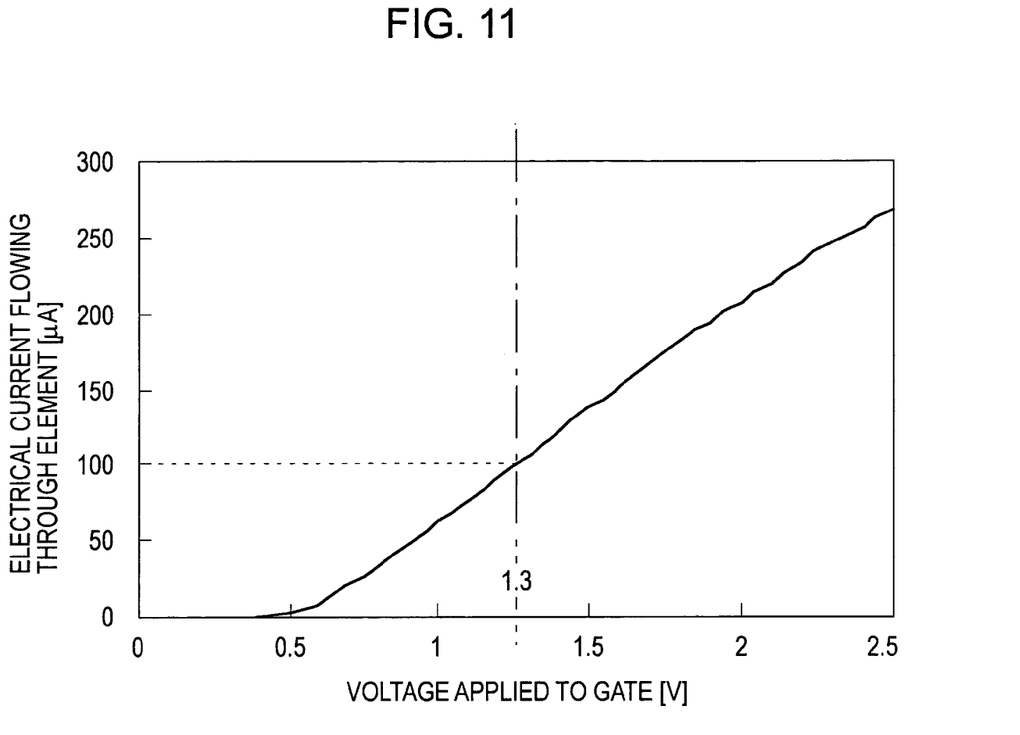
FIG. 11 is a graph showing the relationship between an electrical current flowing through the memory element (2) and the gate voltage of a MOS transistor.

FIG. 11 shows the relationship between an electrical current that flows through the memory element (2) and the gate voltage of a MOS transistor when a ground potential (0 V) is applied to the bit line and Vdd (2.5 V) is applied to the source line.

It can be seen from FIG. 11 that, if the gate voltage of the MOS transistor is set at 1.3 V or lower, the electrical current that flows through the memory element (2) becomes 100 μA or lower. Thus, Write0 is not performed mistakenly, and reading can be performed normally.

Therefore, a normal reading can be performed by applying a ground potential (O V) to the bit line corresponding to the memory cell from which information should be read, by applying Vdd (2.5 V) to the source line, and by applying a voltage of 1.3 V or lower to the word line corresponding to the memory cell from which information should be read.

The higher the gate voltage of the MOS transistor, the larger the reading electrical current can be taken. Consequently, it is preferable that a voltage (1.3 V) as high as possible in a range in which Write0 is not performed mistakenly be applied to the word line corresponding to the memory cell from which information should be read.

(B) When an Electrical Current is Made to Flow in the Direction of Write1

Even if an electrical current is made to flow in the direction of Write1 during a reading from the memory cell, a reading can be performed similarly to the case (A) in which an electrical current is made to flow in the direction of Write0. However, when an electrical current is made to flow in the direction of Write1, the voltage difference between the gate and the source of the MOS transistor needs to be taken into consideration.

In the storage device in which the embodiment of the present invention is applied, by setting the gate voltage to be lower than that during Write0 time and during Write1 time, a reading can be performed by setting the voltage of the bit line and the source line during a reading to be the same as that during Write0 and Write1 time. Thus, the bit line circuit for reading can be simplified, the cell area can be decreased, the power consumption can be reduced, and the access speed can be increased.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device comprising:
    a storage element having characteristics such that a resistance value thereof changes from a high state to a low state as a result of a first electrical signal higher than or equal to a first threshold value being applied and changes from a low state to a high state as a result of a second electrical signal higher than or equal to a second threshold value and whose polarity differs from that of the first electrical signal being applied; and
    a circuit element that is connected in series to the storage element and that serves as a load, the storage element and the circuit element forming a memory cell, and a plurality of memory cells being arranged in a matrix, wherein,
    a circuit resistance value of the circuit element when the storage element is read differs from the circuit resistance value when the storage element is written or erased, and
    an equal voltage is supplied to both a bit line and word line at the time of writing.

2. The storage device according claim 1, wherein a voltage applied to the memory cell when the storage element is read is less than a voltage applied to the memory cell when the storage element is written or erased.

3. The storage device according claim 1, wherein the circuit resistance value of the circuit element when the storage element is read is the resistance value at which a maximum voltage can be applied to the storage element in a range in which the resistance value of the storage element is not changed.

4. The storage device according claim 1, wherein the storage element includes a first electrode and a second electrode, the resistance value of the storage element changes from a high state to a low state as a result of the first electrical signal higher than or equal to the first threshold value being applied between the first electrode and the second electrode, and the resistance value of the storage element changes from a low state to a high state as a result of the second electrical signal higher than or equal to the second threshold value being applied between the first electrode and the second electrode.

5. The storage device according claim 1, wherein the electrical signal and the second electrical signal is a voltage or an electrical current.

6. A semiconductor device comprising:
    a storage element having characteristics such that a resistance value thereof changes from a high state to a low state as a result of a first electrical signal higher than or equal to a first threshold value being applied and changes from a low state to a high state as a result of a second electrical signal higher than or equal to a second threshold value and whose polarity differs from that of the first electrical signal being applied;
    a circuit element that is connected in series to the storage element and that serves as a load, the storage element and the circuit element forming a memory cell, and a plurality of memory cells being arranged in a matrix; and
    a circuit element control unit for allowing a circuit resistance value of the circuit element when the storage element is read differs from the circuit resistance value when the storage element is written or erased, and
    an equal voltage is supplied to both a bit line and word line at the time of writing.

7. A semiconductor device comprising:
    a storage element having characteristics such that a resistance value thereof changes from a high state to a low state as a result of a first electrical signal higher than or equal to a first threshold value being applied and changes from a low state to a high state as a result of a second electrical signal higher than or equal to a second threshold value and whose polarity differs from that of the first electrical signal being applied;
    a circuit element that is connected in series to the storage element and that serves as a load, the storage element and the circuit element forming a memory cell, and a plurality of memory cells being arranged in a matrix; and
    a circuit element control section allowing a circuit resistance value of the circuit element when the storage element is read to differ from the circuit resistance value when the storage element is written or erased, and
    voltages supplied to a bit line and a source line at the time of reading are equal to voltages supplied the source line and the bit line at the time of erasing.

* * * * *